United States Patent
Gupta et al.

(10) Patent No.: US 9,130,552 B2
(45) Date of Patent: Sep. 8, 2015

(54) CROSS-CONDUCTION DETECTOR FOR SWITCHING REGULATOR

(71) Applicant: TEXAS INSTRUMENTS INCORPORATED, Dallas, TX (US)

(72) Inventors: Vishal Gupta, Sunnyvale, CA (US); David R. Olson, Chelmsford, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/072,142

(22) Filed: Nov. 5, 2013

(65) Prior Publication Data

US 2015/0123710 A1    May 7, 2015

(51) Int. Cl.
   *H03K 5/22*    (2006.01)
   *H03K 5/15*    (2006.01)
   *H02M 1/38*    (2007.01)

(52) U.S. Cl.
   CPC .. *H03K 5/15* (2013.01); *H02M 1/38* (2013.01)

(58) Field of Classification Search
   CPC ....................................................... H02M 1/38
   USPC ......... 323/222–226, 265, 282–285, 289, 311, 323/312; 327/22, 23–27, 535, 537, 538, 327/540, 541, 543
   See application file for complete search history.

(56) References Cited

U.S. PATENT DOCUMENTS

| | | | |
|---|---|---|---|
| 5,099,138 A * | 3/1992 | Fukunaga | 327/109 |
| 5,365,118 A * | 11/1994 | Wilcox | 327/109 |
| 5,502,610 A * | 3/1996 | Chaney | 361/18 |
| 5,930,132 A * | 7/1999 | Watanabe et al. | 363/56.04 |
| 6,490,179 B1 | 12/2002 | Boylan et al. | |
| 7,187,226 B2 * | 3/2007 | Audy | 327/387 |
| 7,205,821 B2 * | 4/2007 | Rutter | 327/427 |
| 7,294,992 B2 * | 11/2007 | Yoshikawa | 323/222 |
| 7,446,513 B2 * | 11/2008 | Dikken et al. | 323/271 |
| 7,663,406 B2 * | 2/2010 | Hagino | 326/83 |
| 7,683,594 B2 * | 3/2010 | Kim et al. | 323/282 |
| 7,932,703 B2 | 4/2011 | Brohlin et al. | |
| 8,295,020 B2 * | 10/2012 | Oki | 361/87 |
| 2010/0002472 A1 | 1/2010 | Brohlin et al. | |
| 2013/0147458 A1 * | 6/2013 | Zhak et al. | 323/311 |
| 2013/0293267 A1 * | 11/2013 | Gravati et al. | 327/109 |
| 2014/0139160 A1 * | 5/2014 | Hattori | 318/400.27 |

FOREIGN PATENT DOCUMENTS

WO    WO 2005/055404 A2    6/2005

* cited by examiner

*Primary Examiner* — William Hernandez
(74) *Attorney, Agent, or Firm* — William B. Kempler; Frank D. Cimino

(57) ABSTRACT

An integrated circuit includes a detector configured to monitor a high-drive signal and a low-drive signal that drives a high-side switch and a low-side switch respectively of an integrated circuit switching regulator. The detector monitors both the rising edge and the trailing edge of each of the high-drive and the low-drive signals respectively to determine a timing overlap between the signals and generates a detection signal indicating a dead-time value proportional to the presence or absence of the timing overlap between the signals. An output circuit can be configured to process the detection signal from the detector to enable a correction of the timing overlap between the signals if timing overlap is detected.

19 Claims, 6 Drawing Sheets

CROSS-CONDUCTION DETECTOR FOR SWITCHING REGULATOR

TECHNICAL FIELD

This disclosure relates to power supply circuits, and more particularly to synchronous switching regulator integrated circuits.

BACKGROUND

Cross-conduction in switching regulators occurs when a high-side switch (connected to the input of a power supply) and low-side switch (connected to ground) are turned on at the same time, thereby creating a short circuit from the input supply to ground. This can lead to large current spikes and voltage transients that can degrade the reliability of the switches and decrease performance of precision circuits. Cross-conduction can be avoided by ensuring that the signal that turns on the high-side switch (HDRV) is not high at the same time as the signal that turns on the low-side switch (LDRV). In other words, a non-overlap or "dead-time" between the HDRV and LDRV signals should be provided by circuit design principles and tolerances. One issue with design tolerances is that to ensure there is no signal overlap, more dead-time may be selected than required, which can result in decreased efficiency of the switching regulator. Automated testing systems can be employed to measure the HDRV and LDRV signals to determine if any overlap exists while testing for a minimum of dead-time to promote efficiency.

There are two instances when cross-conduction can occur because of signal overlap. In one instance, overlap can occur when the LDRV signal is rising high (low-side switch is turning on) and HDRV is falling low (high-side switch is turning off). The other overlap case is when the HDRV signal is rising high and the LDRV is falling low. Unfortunately, for switching regulator integrated circuits (ICs) having integrated switches, the HDRV and LDRV signals are internal to the chip and thus not readily observable by test equipment to ensure that they do not overlap. An obvious solution is to route the drive signals external to the IC for testing but such strategy can increase costs of the IC by adding extra pins and also introduce noise in the system.

SUMMARY

This disclosure relates to timing detection and controls for switching regulator integrated circuits. In one example, an integrated circuit includes a detector to monitor a high-drive signal and a low-drive signal that drives a high-side switch and a low-side switch, respectively, of a switching regulator that is part of the integrated circuit. The detector monitors both the rising edge and the trailing edge of each of the high-drive and the low-drive signals, respectively, to determine a timing overlap between the signals and generates a detection signal having a value proportional to the presence or absence of the timing overlap between the high-drive and the low-drive signals. An output circuit processes the detection signal from the detector to provide an output characterizing at least one of a dead-time or cross-conduction of the switching regulator.

In another example, an integrated circuit includes a detector monitors a high-drive signal and a low-drive signal that drives a high-side switch and a low-side switch respectively of an integrated circuit switching regulator. The detector monitors both the rising edge and the trailing edge of each of the high-drive and the low-drive signals respectively to determine a timing overlap between the signals and generates a detection signal indicating a dead-time value proportional to the presence or absence of the timing overlap between the signals. An output circuit processes the detection signal from the detector to enable a correction of the timing overlap between the signals if timing overlap is detected. A pulse width modulated signal is monitored by the detector with the high-drive and low-drive signals to clock the detection signal. The detector generates the detection signal as clocked signal pulses having a pulse-width that is proportional to the dead-time value if no timing overlap is detected and generates no signal pulses for the detection signal if the timing overlap is detected.

In yet another example, an integrated circuit includes a detector configured to monitor a high-drive signal and a low-drive signal that drives a high-side switch and a low-side switch respectively of an integrated circuit switching regulator. The detector monitors both the rising edge and the trailing edge of each of the high-drive and the low-drive signals respectively to determine a timing overlap between the signals and generates a detection signal indicating a dead-time value proportional to the presence or absence of the timing overlap between the signals. An output circuit processes the detection signal from the detector to enable a correction of the timing overlap between the signals if timing overlap is detected. An internal circuit receives the detection signal from the output circuit to automatically adjust the dead-time value if the timing overlap is detected.

DETAILED DESCRIPTION

An integrated circuit is provided for efficient operation of a synchronous switching regulator. Drive signals which control how current is switched in an output inductor of the synchronous switching regulator are monitored internally by the integrated circuit via a detector. The detector determines the presence or absence of dead-time and/or cross conduction between the drive signals and generates a detection signal indicating whether or not a timing overlap between the signals exists. Rather than merely routing the drive signals external to the integrated circuit for processing which can generate noise and increase the cost of the integrated circuit by increasing pin count, the detection signal is processed internally by an output circuit which can report timing overlap (or lack thereof) between the drive signals and/or initiate automatic timing correction within the integrated circuit, if necessary.

Figure 1:
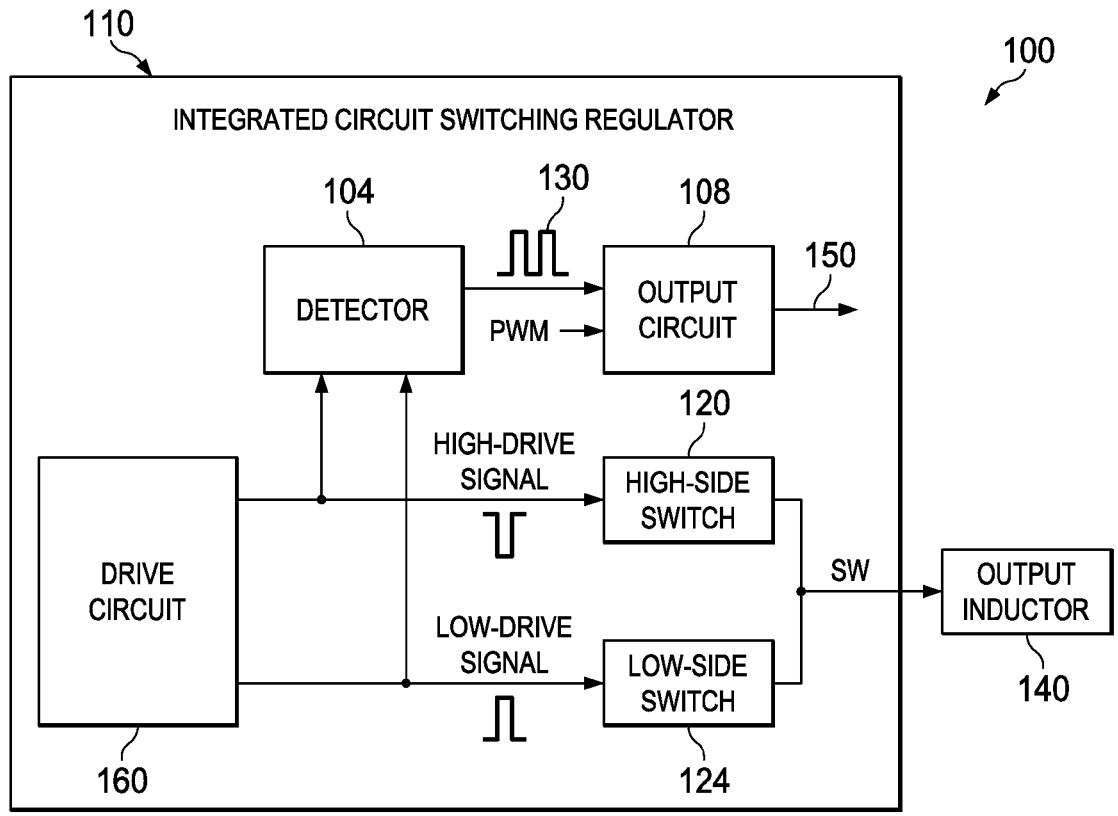
FIG. 1 illustrates an example of an integrated circuit switching regulator.

FIG. 1 illustrates a circuit 100 that includes a detector 104 and output circuit 108 for an integrated circuit switching regulator 110. The circuit 100 can be implemented according to various configurations for detecting dead-time and/or cross-conduction of regulator switches 120 and 124. In some examples, the circuit can be configured without requiring routing such signals externally for additional testing and/or adjustment of dead-time or cross-conduction. For example, the circuit can be configured to monitor multiple internal signals for dead-time and/or cross-conduction, based on such monitoring, the circuit can generate a single signal (e.g., at an integrated circuit pin) from such monitoring to reduce pin-count of the switching regulator 110 which indicates the presence or absence of dead-time. As disclosed herein, various configurations can be provided for monitoring the single signal and for adjusting dead-time in the switching regulator if necessary.

The detector 104 can be configured to monitor a high-drive signal and a low-drive signal that drive a high-side switch 120 and a low-side switch 124, respectively, of the integrated circuit switching regulator 110. The detector 104 can monitor both the rising edge and the trailing edge of each of the high-drive and the low-drive signals respectively to determine a timing overlap between the signals. The detector 104 can generate a detection signal 130 indicative of the timing overlap or absence thereof. For example, the detection signal 130 can be a single signal representing a dead-time and/or cross-conduction. For example, the output signal can provide a value, corresponding to a pulse width of the detection signal 130, that is proportional to the presence or absence of the timing overlap between the signals (e.g., indicating dead-time or cross-conduction).

By way of example, if timing overlap between the high and low-drive signals is detected by the detector 104, then inadequate dead-time or cross-conduction can be determined to be present, whereas if no timing overlap is detected, then suitable dead-time or lack of cross-conduction may be determined. For example, a DC value detected at about 50% of supply voltage indicates no overlap or cross-conduction and a DC value detected at about the supply voltage or near ground indicates a timing overlap. As shown, a pulse width modulated (PWM) signal can be provided to the output circuit 108 to clock the detection signal 130. The detector 104 thus can generate the detection signal 130 as signal pulses, which are clocked by the PWM signal and having a pulse-width that is proportional to the dead-time value or cross-conduction based on the presence or absence of overlap between the high- and low-drive signals.

Output from the high-side switch 120 and low-side switch 124 drives an output inductor 140 to generate a DC voltage. Each switch should be on at different times to avoid cross-conduction in the switches (e.g., when both switches are on at the same time cross-conduction between switches can occur). Ideally, the high-side switch 120 and the low-side switch 124 are controlled to turn on via the high-drive and the low-drive signals such that the switches are not conducting at the same time yet not leaving either switch in the off state for too long to promote efficiency in the switching regulator 110.

As shown, a drive circuit 160 generates the high-drive signal and the low-drive signal, respectively. The drive circuit 160 can receive inputs (e.g., digital register value) to alter the timing of the drive signals and ultimately the timing of the high-side switch 120 and the low-side switch 124. For example, in an automated test environment, if inadequate dead-time were detected via an output 150 from the output circuit 108, a register value could be altered inside the drive circuit 160 to change the timing between the drive signals incrementally (e.g., 5 nanosecond increments). In another example, the output 150 could be fed-back to the drive circuit 160 or other control circuitry to implement automatic timing adjustment for the high and low-drive signals (See FIG. 7).

The output circuit 108 can be configured to provide an output indicative of dead-time or cross-conduction based on the detection signal 130 from the detector 104. In some examples, the signal provided by the output circuit can be processed to enable a correction of the timing overlap between the signals to mitigate dead-time and cross-conduction. Such timing correction can be provided by external circuitry or by one or more possible configurations of the output circuit 108, such as the example output circuits illustrated and described below with respect to FIGS. 4-7. For example, configurations can include monitoring the output 150 from the output circuit 108 via external equipment (e.g., automated test equipment (ATE)) and initiating a timing adjustment via a register adjustment (e.g., changing a register digital value) in the switching regulator 110, for example.

In other examples, timing correction can be provided via internal monitoring and adjustments within the switching regulator 110 without external monitoring. In either configuration, pin count of the switching regulator 110 can be reduced since in one configuration only a single pin is employed to monitor the output(s) 150 or, in the internal configuration, no pins are utilized as the output 150 can be processed internally to the IC switching regulator 110. Thus, rather than route both the high-drive and the low-drive signals externally for monitoring as for conventional circuits, one or less (i.e., zero) pins can be employed in the switching regulator 110 since the detector 104 only generates the detection signal 130 from the logic employed for monitoring multiple drive signals.

The detector 104 and output circuit 108 cooperate to detect cross-conduction or dead-time for switches 120 and 124 of the IC switching regulator 110 without the need to monitor the high-drive and low-drive signals via an ATE, for example. The circuit 100 can also be modified, such as disclosed herein, to measure dead-time without observing the high-drive and low-drive signals externally. The absence of cross-conduction in switching regulator ICs with integrated switches manifests itself by periodic voltage transitions to (approximately) −1V on the node common to the high- and low-side switch, commonly referred to as the SW node and shown as SW driving the inductor 140. These transitions should be monitored to ensure adequate dead-time. In other examples, since regulators with integrated switches do not provide natural access to the voltage signals that turn on the high-side (high-drive) and low-side (low-drive) switches 120 and 124, these signals could be routed to pins in a test-mode and monitored for overlap.

The circuit 100 detects the presence of cross-conduction or dead-time without the need to monitor potentially noisy SW, low-drive, and high-drive signals external to the IC switching regulator 110. The detector 104 and output circuit 108 minimize the need to detect cross-conduction by monitoring the SW node for periodic −1V transitions, for example. Detecting these voltage transients can be difficult in the production test environment because of undesired parasitic elements inherent to the test equipment. Thus, the large transient voltage drops across these parasitic elements that occur when the IC switching regulator 110 is operational can overwhelm the −1V voltage on the SW node, making it difficult to detect. By utilizing the detector 104 and output circuit 108, routing the high-drive signal and low-drive signal to an external pin becomes unnecessary. The high-drive and low-drive signals are switching signals that have the potential of coupling noise onto other noise-sensitive signals and potentially corrupting them. Therefore, routing these noisy signals in the layout of large, complex ICs to an external pin can entail significant risk, and the circuit 100 mitigates such risk.

The circuit 100 can be scaled to include an indirect, noise-immune measurement of dead-time or cross-conduction without requiring to measure it directly at the SW node in a noisy environment that does not yield reliable results. The circuit 100 can also be scaled to eliminate the need to measure dead-time on an ATE, thereby reducing test-time and test costs.

In one example, the circuit 100 can be provided as a circuit (e.g., integrated circuit, discrete circuit, combination of integrated circuit and discrete circuits) for generating a switched DC voltage via the inductor 140. Discrete control elements can be provided within the drive circuit 160, for example, for adjusting dead-time. This could include a processor operating firmware to control operation of the drive circuit 160. In another example, the drive circuit 160 could be a hard-wired function wherein dedicated logic and switching elements control the drive circuit 160. In yet another example, a combination of programmed elements and circuit logic elements could cooperate to perform the operation of the drive circuit 160.

It is noted that the examples described herein can be provided via different analog and/or digital circuit implementations. For instance, in some cases, field effect transistors can be employed and in other cases junction transistors or diodes employed. Some components can be employed as discrete implementations such as a comparator comparing a reference signal to a control signal and in other examples, controllers operating via processor instructions and exchanging data via D/A and A/D converters could be employed to monitor drive signals and generate timing adjustment signals within the switching regulator 110. The circuit 100 can employ various means of monitoring electrical parameters such as monitoring voltage and/or current via the detector 104. It can also employ a microcontroller or other control circuitry capable of digitizing these parameters, storing digital interpretations of these parameters in its memory, and associating acquired values with events in the circuit 100 operation. This includes performing logical and arithmetical operations with the acquired values, for example.

Figure 2:
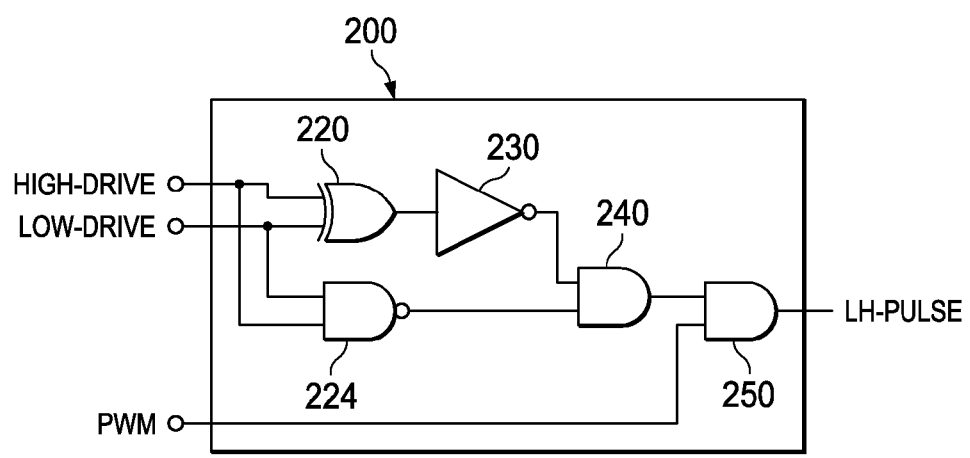
FIG. 2 illustrates an example detector for an integrated circuit switching regulator.

FIG. 2 illustrates an example detector 200 for an integrated circuit switching regulator. The detector 200 monitors a high-drive signal and low-drive signal via gates 220 (e.g., EXCLUSIVE OR gate) and 224 (e.g., NAND gate). Output from gate 220 is inverted via gate 230 (e.g., inverter) which feeds gate 240 (e.g., AND gate). Output from gate 224 drives the other leg of gate 240. Output from gate 240 along with a PWM signal drive gate 250 (e.g., AND gate) which generates the detection signal described above with respect to FIG. 1 and illustrated as LH-PULSE. It is noted that in addition or as an alternative to the approach depicted in FIG. 2, a similarly configured circuit could be employed using an inverted version of the PWM signal to detect dead-time between the falling edge of high-drive and the rising edge low-drive, for example.

Figure 3:
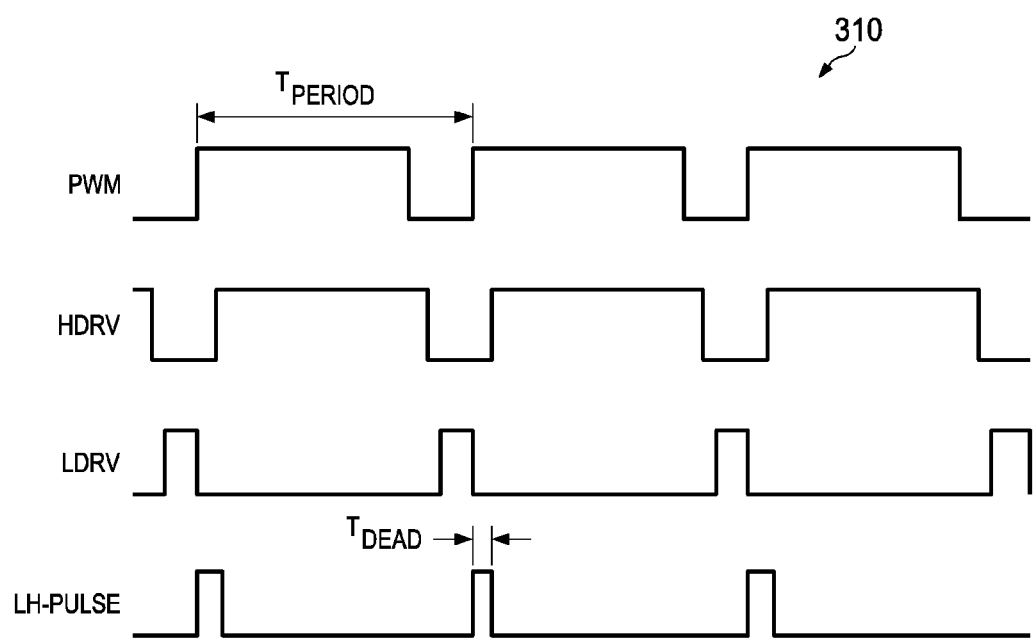
FIG. 3 illustrates an example timing diagram for the example detector illustrated in FIG. 2.

An example of timing for the high-drive signal, low-drive signal, PWM signal, and resultant LH-PULSE output in the detector 200 are shown in the timing diagram 310 of FIG. 3. If the low-drive and high-drive signals do not overlap, e.g., there is no cross-conduction, the detector 200 of FIG. 2 will generate a series of pulses at the LH-PULSE node that are as wide as the dead-time between falling edge of low-drive and the rising edge of high-drive (TDEAD) and have a period the same as the PWM switching period (TPERIOD). The switching LH-PULSE signal is then utilized as the drive signal for the subsequent output correction configurations which are disclosed herein with respect to FIGS. 4-8. In another example, an HL-Pulse can also be generated where cross-conduction or dead-time is detected on opposite edges of the high-drive and low-drive signals, respectively. Such HL-Pulse could be detected at the output of the and gate 240 of FIG. 2, for example. In an example implementation, both the LH-Pulse and the HL-Pulse are monitored as described herein.

Figure 4:
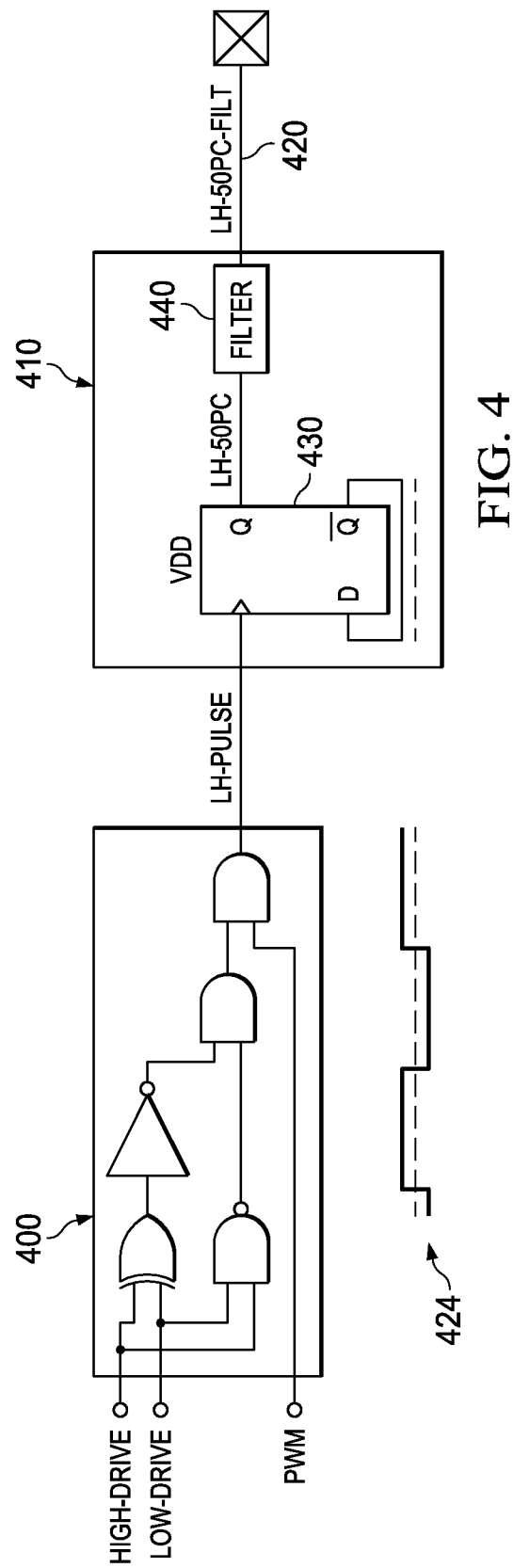
FIG. 4 illustrates another example of a detector and output circuit.

FIG. 4 illustrates an example detector 400 and output circuit 410 having a single filtered reporting output 420 for an integrated circuit switching regulator. In this example, the LH-PULSE signal from the detector 400 can be processed to either detect the presence of cross-conduction or, if required, measure the dead-time (to quantify the absence of cross-conduction). As shown in the example of FIG. 4, the LH-PULSE signal can be converted to a 50% duty cycle square wave, (timing shown at diagram 424) as output LH-50PC, through a flip-flop 430. This square wave can be subsequently averaged by an on-chip filter 440 to generate a quiet, filtered signal, LH-50PC-FILT, with a DC value of half the logic supply voltage (VDD/2), for example. The instance when the signal LH-50PC-FILT can have a zero value or can be pulled to VDD is if the DETECT-LH signal is not switching which, in turn, implies an overlap of the high-drive and low-drive signal and, therefore, cross-conduction has occurred. Thus, monitoring the signal LH-50PC-FILT for a non-zero, non-VDD value detects the absence of cross-conduction. This signal representing cross-conduction (or dead-time) can be monitored easily by an external ATE or internal circuitry, for example.

Figure 5:
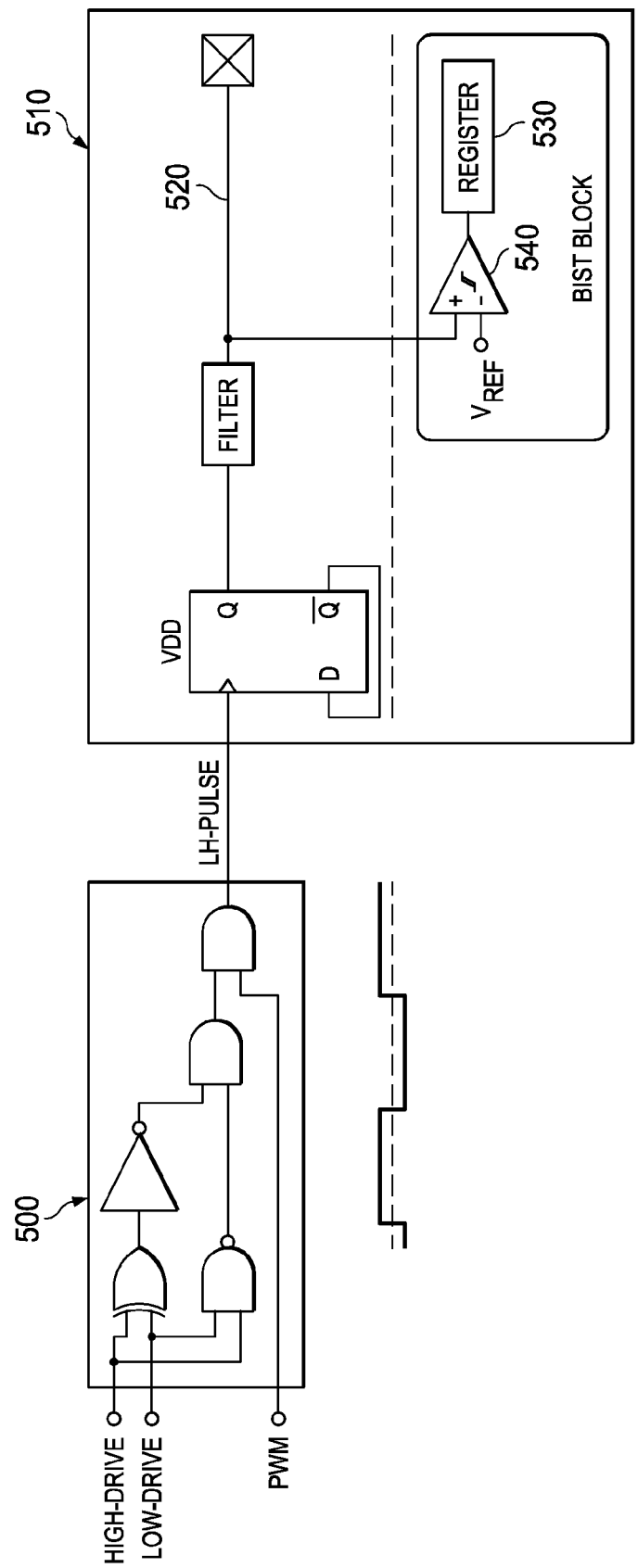
FIG. 5 illustrates yet another example detector and output circuit.

FIG. 5 illustrates an example detector 500 and output circuit 510 having a single filtered reporting output 520 that is captured by (e.g., stored in memory) a register 530 of an integrated circuit switching regulator. In this example, the output circuit 310 depicted above can be extended to implement a Built-In-Self-Test (BIST) circuit, and thus eliminating the need for testing this parameter on an external ATE, for example. An integrated comparator 540 (e.g., window comparator, single threshold comparator) can compare the LH-50PC-FILT signal to a reference voltage (VREF) to determine the presence of adequate dead-time and store the result in memory such as the on-chip register 530. For example, a logic '1' in the register 530 implies the presence of dead-time, while logic '0' implies cross-conduction. Associated on-chip circuitry (e.g., in the driver circuit 160) can be configured to adjust relative timing for the drive signals based on the value stored in the register 530, such as via the drive circuit disclosed with respect to FIG. 1. In one example, a production operator could set the register value manually to adjust the timing. In another example, the register value could be employed as feedback to adjust the drive circuit timing automatically as disclosed with respect to FIG. 8.

Figure 6:
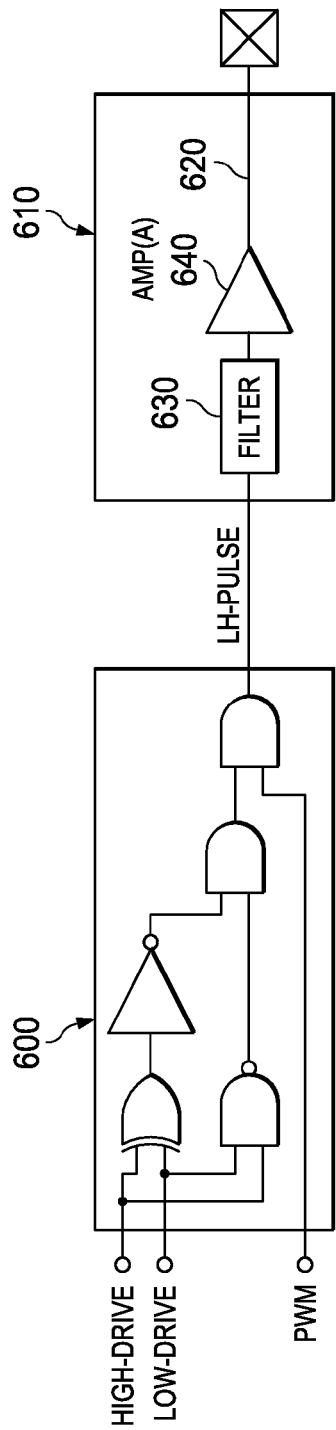
FIG. 6 illustrates still another example detector and output circuit having an amplified reporting output for an integrated circuit switching regulator.

FIG. 6 illustrates an example detector 600 and output circuit 610 having an amplified reporting output 620 for an integrated circuit switching regulator. In this example, the LH-PULSE signal from the detector 600 can be employed to quantify the absence of cross-conduction, e.g., measure the dead-time. This can be implemented, for example, by filtering the LH-PULSE signal directly by an on-chip filter 630. The output of the filter 630 can provide a DC voltage, LH-FILT, which is proportional to the width of the pulses of the LH-PULSE signal which, in turn, is proportional to the "dead-time." The value of this signal is TDEAD/TPERIOD. This signal can be amplified by an amplifier 640 with gain A (LH-FILT-AMP). The amplified signal can be exposed via a pin and can be measured by an ATE which can subsequently calculate the dead-time by determining TPERIOD. For instance, the TPERIOD can be measured efficiently through the SW node described above, for example.

Figure 7:
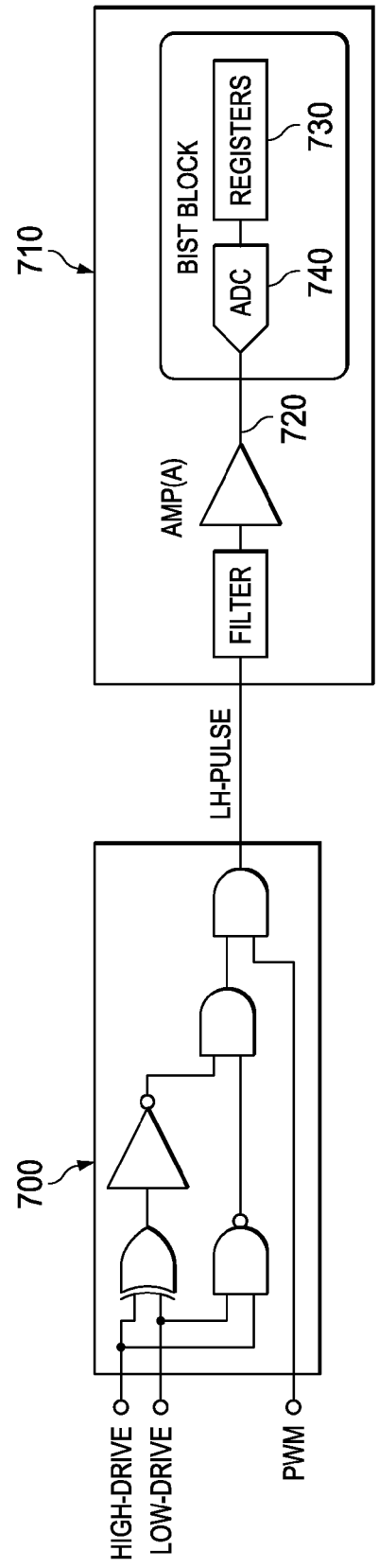
FIG. 7 illustrates an example detector and output circuit having an amplified reporting output that is captured by a register for an integrated circuit switching regulator.

FIG. 7 illustrates an example circuit implementing a detector 700 and output circuit 710. The output circuit 710 provides an amplified reporting output 720 that is captured by a register 730 for an integrated circuit switching regulator. As an example, the output circuit 610 disclosed with respect to FIG. 6 can be extended to provide a Built-In-Self-Test (BIST) integrated into the circuit 700 of FIG. 7. By integrating the BIST in the circuit 700, the need for testing this parameter using an external ATE, for example, can be eliminated. In the example of FIG. 7, the amplified signal, LH-FILT-AMP, at 720 is fed to an analog-to-digital converter (ADC) 740. The ADC converts the analog output to a corresponding digital representation whose output is stored in a register bank 730, thereby storing a digital value representing one or more of dead-time or cross-conduction. The stored digital value can subsequently be transmitted externally (or internally for automated correction) via a number of communication protocols (e.g., PMBus, I$^2$C, and so forth).

Figure 8:
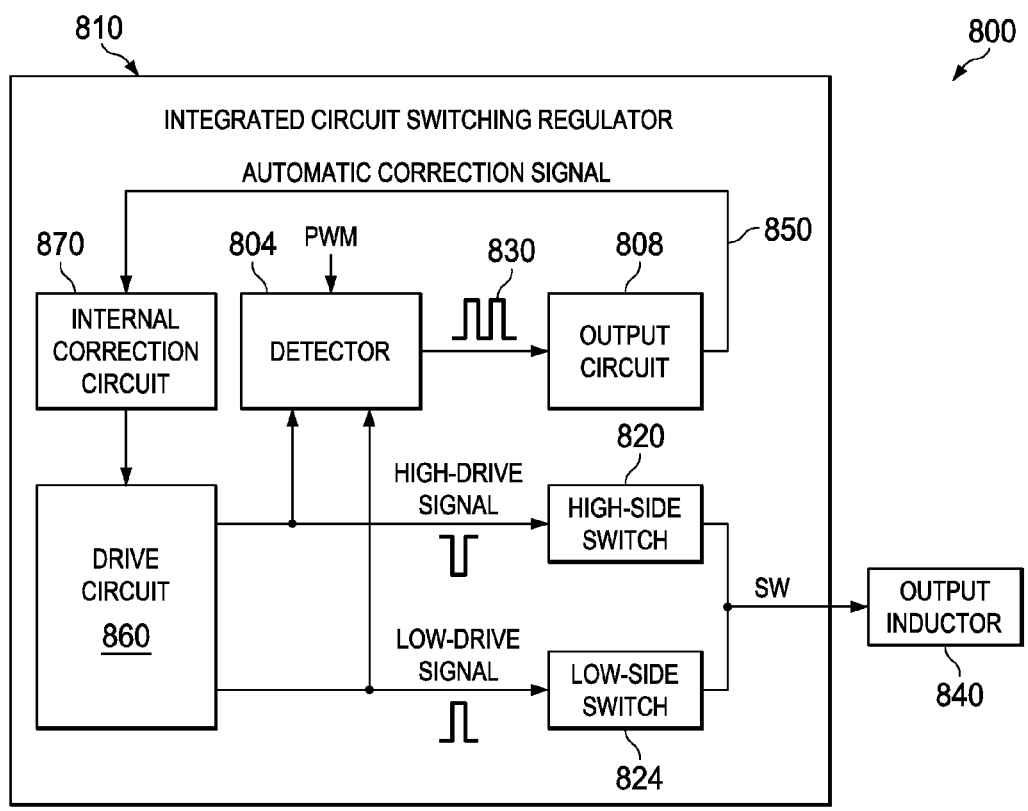
FIG. 8 illustrates a detector and output circuit that generates an automatic dead-time correction signal for an integrated circuit switching regulator.

FIG. 8 illustrates an example of an integrated circuit 800 having a detector 804 and output circuit 808 configured to generate a correction signal for an integrated circuit switching regulator 810. For example, the correction signal can be utilized to correct one of a detected dead-time or cross-conduction for the switching regulator. Similar to the circuit 100 described above with respect to FIG. 1, the detector 804 can be configured to monitor a high-drive signal and a low-drive signal that drive a high-side switch 820 and a low-side switch 824 respectively of the integrated circuit switching regulator 810. For instance, the detector 804 monitors both the rising edge and the trailing edge of each of the high-drive and the low-drive signals respectively to determine a timing overlap between the signals and to generate a detection signal 830 indicating the presence or absence of the timing overlap between the signals (e.g., pulse width of signal indicating value of dead-time). To enable the detection of overlap between the high-drive and low-drive signals, for example, a PWM signal, which is provided for driving respective switches, can be provided to the detector 804 along with the high-drive and low-drive signals to clock the detection signal 830. If timing overlap between the high and low-drive signals is detected by the detector 804, then inadequate dead-time can be determined to be present, whereas if no timing overlap is detected, then suitable dead-time may be determined. As an example, the detector 804 can generate the detection signal 830 as clocked signal pulses having a pulse-width that is proportional to the dead-time value if no timing overlap is detected and the PWM signal is logic '1', and generates no signal pulses for the output signal if the timing overlap is detected, for example. In other examples, the detector 804 can be configured provide the detection signal 830 with a pulse width proportional to cross-conduction when overlap is detected when gated by the PWM signal. The output circuit 808 and internal correction circuit 870 can also be implemented as a counter that decreases the dead-time by a fixed amount (e.g., step) each time a dead-time pulse is detected. For example, if no pulse is detected the counter can increment and move the dead-time back until pulses are derived.

Output from the high-side switch 820 and low-side switch 824 drives an output inductor 840 to generate a DC voltage. Each switch should be on at different times to avoid cross-conduction in the switches (e.g., when both switches are on at the same time cross-conduction between switches can occur). Ideally, the high-side switch 820 and the low-side switch 824 are timed to turn on via the high-drive and the low-drive signals such that the switches are not conducting at the same time yet not leaving either switch in the off state for too long to promote efficiency in the switching regulator 810.

A drive circuit 860 generates the high-drive signal and the low-drive signal, respectively, based on the PWM signal that is also provided to the detector 804. The drive circuit 860 can receive feedback inputs (e.g., digital register value) from an internal circuit 870 to alter the timing of the drive signals and ultimately the timing of the high-side switch 820 and the low-side switch 824. As shown, an automatic correction signal from the output circuit 808 is fed-back to the internal circuit 870 for automatic timing adjustment of the high-drive and low-drive signals via the drive circuit 860. The automatic correction signal from the output circuit 808 can be an analog value, a digital value, or a combination of analog/digital values representing the timing overlap (or lack thereof) between the high-drive and low-drive signals as detected by the detector 804.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit comprising:
    a detector configured to monitor a high-drive signal and a low-drive signal that drive a high-side switch and a low-side switch, respectively, of a switching regulator that is part of the integrated circuit, wherein the detector monitors both a rising edge and a trailing edge of each of the high-drive and the low-drive signals, respectively, to determine a timing overlap between the signals, and to generate a detection signal having a value proportional to a presence or absence of the timing overlap between the high-drive and the low-drive signals; and
    an output circuit configured to process the detection signal from the detector to provide an output characterizing at least one of a dead-time or cross-conduction of the switching regulator and to adjust the timing in the next switching cycle to prevent or reduce cross-conduction of the switching regulator, wherein the output circuit further comprises a flip flop that is clocked from the detection signal of the detector to provide a fifty percent duty cycle signal representing the timing overlap between the signals.

2. The integrated circuit of claim 1, wherein the output circuit further comprises a filter that is applied to the fifty percent duty cycle signal to generate a DC voltage signal representing the timing overlap between the signals, wherein a DC value at about 50% of a supply voltage indicates no overlap or cross-conduction and wherein a DC value at about the supply voltage or at about ground indicates the presence of the timing overlap.

3. The integrated circuit of claim 2, wherein the output circuit further comprises a comparator that compares the DC voltage signal to a predetermined reference signal to generate a comparator output that represents the timing overlap between the signals.

4. The integrated circuit of claim 3, wherein the output circuit further comprises a register that is clocked from the comparator output, wherein a logic high in the register indicates a presence of dead-time between the signals and wherein a logic low in the register indicates the presence of the timing overlap between the high-drive and the low-drive signals.

5. An integrated circuit comprising:
a detector configured to monitor a high-drive signal and a low-drive signal that drive a high-side switch and a low-side switch, respectively, of a switching regulator that is part of the integrated circuit, wherein the detector monitors both a rising edge and a trailing edge of each of the high-drive and the low-drive signals, respectively, to determine a timing overlap between the signals, and to generate a detection signal having a value proportional to a presence or absence of the timing overlap between the high-drive and the low-drive signals; and
an output circuit configured to process the detection signal from the detector to provide an output characterizing at least one of a dead-time or cross-conduction of the switching regulator;
further comprising a pulse width modulated signal that is monitored by the detector with the high-drive and low-drive signals to clock the detection signal, wherein the detector generates the detection signal as clocked signal pulses having a pulse-width that is proportional to the dead-time if no timing overlap is detected and generates no signal pulses for the detection signal if the timing overlap is detected.

6. The integrated circuit of claim 5, wherein the output circuit drives a filter to generate a DC voltage representing the timing overlap between the signals.

7. The integrated circuit of claim 6, further comprising an amplifier to amplify the DC voltage and provide an external DC output voltage to measure the timing overlap between the signals.

8. The integrated circuit of claim 7, further comprising an analog to digital converter (ADC) to convert the external DC output voltage to a register value that is communicated externally from the switching regulator via a communication protocol.

9. The integrated circuit of claim 8, wherein the communication protocol includes PMBus protocol or an I²C protocol.

10. The integrated circuit of claim 8, wherein the register value is employed by an internal circuit to automatically adjust the timing overlap between the signals.

11. An integrated circuit comprising:
a detector configured to monitor a high-drive signal and a low-drive signal that drive a high-side switch and a low-side switch respectively of an integrated circuit switching regulator, wherein the detector monitors both a rising edge and a trailing edge of each of the high-drive and the low-drive signals, respectively, to determine a timing overlap between the signals, and to generate a detection signal indicating a dead-time value proportional to a presence or absence of the timing overlap between the signals; and
an output circuit configured to process the detection signal from the detector to enable a correction of the timing overlap between the signals if timing overlap is detected, wherein a pulse width modulated signal is monitored by the detector with the high-drive and low-drive signals to clock the detection signal, wherein the detector generates the detection signal as clocked signal pulses having a pulse-width that is proportional to the dead-time value if no timing overlap is detected and generates no signal pulses for the detection signal if the timing overlap is detected.

12. The integrated circuit of claim 11, wherein the output circuit further comprises a flip flop that is clocked from the detection signal of the detector to provide a fifty percent duty cycle signal representing the timing overlap between the signals.

13. The integrated circuit of claim 12, wherein the output circuit further comprises a filter that is applied to the fifty percent duty cycle signal to generate a DC voltage signal representing the timing overlap between the signals, wherein a DC value at about 50% of a supply voltage indicates no overlap or cross-conduction and a DC value at about the supply voltage or at about ground indicates a timing overlap.

14. The integrated circuit of claim 13, wherein the output circuit further comprises a comparator that compares the DC voltage signal to a predetermined reference signal to generate a comparator output that represents the timing overlap between the signals.

15. The integrated circuit of claim 14, wherein the output circuit further comprises a register that is clocked from the comparator output, wherein a logic high in the register indicates a presence of dead-time between the signals and wherein a logic low in the register indicates the presence of the timing overlap between the signals.

16. The integrated circuit of claim 11, wherein the output circuit generates an amplified DC output voltage representing the timing overlap between the signals.

17. The integrated circuit of claim 16, further comprising an analog to digital converter (ADC) to convert the amplified DC output voltage to a register value that is communicated externally from the integrated circuit switching regulator via a communication protocol.

18. An integrated circuit comprising:
a detector configured to monitor a high-drive signal and a low-drive signal that drive a high-side switch and a low-side switch respectively of an integrated circuit switching regulator, wherein the detector monitors both a rising edge and a trailing edge of each of the high-drive and the low-drive signals respectively to determine a timing overlap between the signals, and to generate a detection signal indicating a dead-time value proportional to a presence or absence of the timing overlap between the signals;
an output circuit configured to process the detection signal from the detector to enable a correction of the timing overlap between the signals if timing overlap is detected; and
an internal circuit including a digital storage element having a value that is incremented by the detection signal from the output circuit to automatically adjust the dead-time value if the timing overlap is detected in order to minimize the dead time of the switching regulator.

19. An integrated circuit comprising:
a detector configured to monitor a high-drive signal and a low-drive signal that drive a high-side switch and a low-side switch respectively of an integrated circuit switching regulator, wherein the detector monitors both a rising edge and a trailing edge of each of the high-drive and the low-drive signals respectively to determine a timing overlap between the signals, and to generate a detection signal indicating a dead-time value proportional to a presence or absence of the timing overlap between the signals;

an output circuit configured to process the detection signal from the detector to enable a correction of the timing overlap between the signals if timing overlap is detected; and an internal circuit that receives the detection signal from the output circuit to automatically adjust the dead-time value if the timing overlap is detected;

further comprising a pulse width modulated signal that is monitored by the detector with the high-drive and low-drive signals to clock the detection signal, wherein the detector generates the detection signal as clocked signal pulses having a pulse-width that is proportional to the dead-time value if no timing overlap is detected and generates no signal pulses for the detection signal if the timing overlap is detected.

* * * * *